United States Patent [19]

Hung et al.

[11] Patent Number: 5,718,029
[45] Date of Patent: Feb. 17, 1998

[54] PRE-INSTALLATION OF PUMPING LINE FOR EFFICIENT FAB EXPANSION

[75] Inventors: Cheng-Chang Hung, Tainan;
Horng-Jong Wang, Taichung;
Yu-Cheng Su, Tainan, all of Taiwan

[73] Assignee: Vanguard International Semiconductor Corporation, Hsin-Chu, Taiwan

[21] Appl. No.: 746,029

[22] Filed: Nov. 6, 1996

[51] Int. Cl.$^6$ .................. B23Q 17/00; F16L 5/00
[52] U.S. Cl. ........................ 29/407.01; 137/357
[58] Field of Search ............... 29/407.01, 426.1; 414/217, 935; 137/357, 362

[56] References Cited

U.S. PATENT DOCUMENTS

| | | | |
|---|---|---|---|
| 3,824,839 | 7/1974 | Briggs. | |
| 4,558,587 | 12/1985 | Fruzzetti. | |
| 4,699,640 | 10/1987 | Suzuki et al. | 55/385 |
| 4,722,298 | 2/1988 | Rubin et al. | 414/217 |
| 4,895,689 | 1/1990 | Gerlowski. | |
| 5,013,384 | 5/1991 | Mellink et al. | 414/217 |
| 5,058,491 | 10/1991 | Wiemer et al. | 98/115.3 |
| 5,217,559 | 6/1993 | Moshehi et al.. | |
| 5,355,571 | 10/1994 | Miche | 29/426.1 |

FOREIGN PATENT DOCUMENTS 2696429  4/1994  France ........................ 414/935

*Primary Examiner*—S. Thomas Hughes
*Assistant Examiner*—Tisa Stewart
*Attorney, Agent, or Firm*—George O. Saile; Stephen B. Ackerman

[57] ABSTRACT

A procedure for the installation of clean room processing tools which require rough pumping equipment located in areas outside of the clean room. Instead of simultaneously installing and testing the pumping equipment and the processing tool, the pumping equipment is installed first along with its associated support services. Foreline piping, terminating in the proximity of the processing tool vacuum port is also installed and capped off at this time. Functional testing and qualification of the rough pumping equipment is done and then the processing tool is moved into place and connected to the pumping line on the clean room floor. This independent and sequential installation procedure reduces perturbations of on-going manufacturing activity in the clean room area and also minimizes the risk of costly damage to the processing tool by faulty, un-tested, pumping equipment. In addition, since the rough pumping equipment can be procured and installed before hand, time can be saved by getting the processing tool on-line faster.

9 Claims, 3 Drawing Sheets

PRE-INSTALLATION OF PUMPING LINE FOR EFFICIENT FAB EXPANSION

BACKGROUND OF THE INVENTION

(1) Field of the Invention

The invention relates to processes for the manufacture of semiconductor devices and more particularly to the installation and qualification of processing equipment in a clean room facility.

(2) Description of Prior Art

The fabrication of integrated circuit chips requires the use of extremely sophisticated and expensive processing equipment. A great many of these processing tools perform their chemical functions on silicon wafers through the use of a gaseous ambient and often require the use of high vacuum and reduced gas pressures. Machines with such diverse functions as chemical vapor deposition (CVD) tools, epitaxial reactors, sputtering tools, metal deposition evaporators, and plasma and reactive ion etching (RIE) tools all require the use of pumping packages which provide and high vacuum and gaseous ambient control.

The designers of semiconductor fabrication facilities necessarily concern themselves with the operation of these pumping stations, in particular with regards to the safe handling of gaseous discharges, noise, vibration, and general maintenance. Pumping equipment used for chamber evacuation and for maintaining flows of processing gases can be identified by two stages. The primary, or roughing stage involves mechanical pumps which have high pumping speed and capacity to preform the evacuation of process chambers from atmosphere down into the milliTorr range of pressure. This primary pumping equipment comprises large motor driven mechanical pumps which produce noise, vibration, and other undesirable disturbances to a clean room facility. They are best located in dedicated locations, apart from the locations of the tools which they service and are connected thereto by piping of appropriate size and construction. They can be contained in areas having a lower degree of cleanliness than that maintained for processing tools on the manufacturing floor. The pumping fluids used by these pumps are often attacked by corrosive elements in the gases resulting in pump damage and fluid deterioration. The pumps, therefore require frequent maintenance of a degree which would be disruptive to the manufacturing process, were they located in the same area as the tools themselves.

The secondary pumping stage, used when high vacuum is required, is typically accomplished by diffusion pumps which operate close to the processing chambers of the equipment they service and are non-mechanical in operation. These secondary pumps are part of the processing tool and are in turn backed up by the remote roughing pumps. Other types of "dry" mechanical pumps known as Roots blowers are sometimes used in series with oil based roughing pumps to achieve high pumping speeds.

An overall design and operation of a modern clean room facility for the fabrication of integrated circuits is dealt with by Wiemer et.al. U.S. Pat. No. 5,058,491. These authors provide for remote supporting equipment associated with integrated circuit fabrication tools to be located in a floor area below the clean room facility. They specify such equipment as motors, blowers, power supplies, heat exchangers, chemical transfer cabinets, etc. Roughing pump assemblies can also be located in such an area. Earlier clean room designs employed core areas which contained such support equipment and pumping stations and which located on the same floor level as the clean room areas and were isolated from the clean areas by a walled enclosure. Such single level fab designs are not as efficient and practical as the multi-level design outlined by Wiemer et.al. The multi-level facility lends itself particularly well to the maintenance of rough pumping equipment with minimal disturbance of the ongoing manufacturing process.

Suzuki et.al. U.S. Pat. No. 4,699,640 discuss the configuration of a clean room having areas of different degrees of cleanliness but do not discuss the installation and testing of pumping equipment or processing tools.

The installation, removal, or re-location of processing equipment is of significant concern to the efficient operation of a integrated circuit processing facility. Such operations come into play when older tools are replaced by newer ones, or when fab expansion or process redesign requires re-location or addition of processing tools. Conventionally, a processing tool is installed simultaneously with its support equipment. Such equipment includes electrical and cooling facilities, gas/air ventilation and exhaust facilities, operating gas supply, and primary vacuum pumping equipment. Simultaneous initial leak testing of the roughing pump assembly and the processing tool is not only disruptive to the ongoing clean area processing operations but is also potentially harmful to the processing tool itself. A simple example is backstreaming and damage to diffusion pumping fluids caused by fore line leaks.

The primary or rough pumping equipment, although custom configured for the tool it supports, can be acquired, installed, and qualified prior to the installation of the tool itself. Having the rough pumping equipment installed and tested ahead of time shortens the tool preparation time and greatly minimizes disruptions of process floor operations. It is this procedural sequence that is taught by this invention.

SUMMARY OF THE INVENTION

It is an object of this invention to provide a more efficient procedure for the installation of a semiconductor processing tool which requires the use of mechanical rough gas pumping equipment located in an area remote to the processing tool itself. The efficiency improvement of this procedure not only minimizes disturbance of production activity on the manufacturing floor, but also expedites the installation and qualification of the processing equipment itself.

It is a further object of this invention to reduce risk of damage to a processing tool caused by improper pumping station operation during initial start-up of the process tool.

These goals are accomplished by completing the installation and qualification of the remote pumping equipment and including foreline piping prior to the installation of the processing tool. The pumping equipment is acquired, installed and qualified before the related processing tool is positioned in the clean room manufacturing area. The pumping line is terminated and capped off in the manufacturing area where the processing tool is to be installed.

DESCRIPTION OF THE PREFERRED EMBODIMENTS

Figure 1:
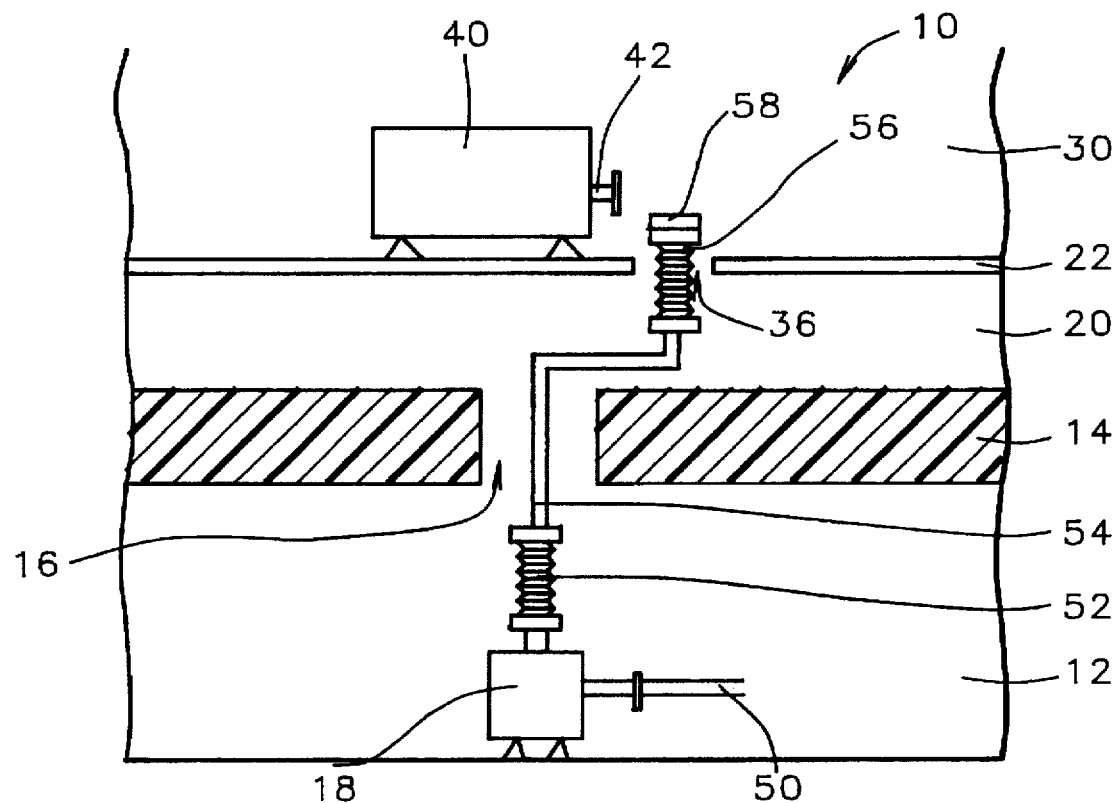
FIG. 1 is a cross sectional view of the configuration of the first embodiment of this invention during pump testing.

Accordingly, the embodiments of this invention will be presented by first describing the scenario into which they are implemented. Referring first to FIG. 1, a building 10 for the fabrication of integrated circuits is provided. The building 10 has a first floor 12 in which is maintained an air cleanliness level of class 1,000 or greater. Located on this floor are various and sundry pieces of equipment used to support an integrated circuit fabrication line located on a second floor 30 above. Such support equipment includes primary mechanical gas pumping stations which are used to evacuate and maintain controlled gas flows in the processing equipment. In addition, facilities are provided on this floor 12 for processing and disposing of gases exhausted by these pumps. Immediately above the first floor 10 is a re-enforced concrete floor 14 which may be of waffle construction having an array of openings 16 where piping from the vacuum pumps may pass through to access the processing tools. The processing tools themselves are positioned on a additional raised floor 22. The air on the processing floor 30 is maintained at typical clean room purity levels by an appropriate gas/air filtration and distribution system.

A new piece of processing equipment 40 is to be installed on the floor 30. The equipment 40 requires the use of a dedicated high velocity roughing pump station. The location of the equipment is determined according to its role is the process stream. In a first embodiment of this invention, the roughing pump station 18 is first moved into position on the first floor 12 under the planned position of the processing tool 40. The acquisition of this piece of equipment 18 can typically be made prior to that of the processing tool itself, making its early installation expedient. Electrical power is provided to the pump unit 18 from supplies located on the first floor 12. The exhaust 50 of the pump unit is routed to appropriate exhaust processing equipment such as scrubbers and filters also located on the first floor 12 of the facility.

The suction line 54 from the pump body Is constructed of appropriate materials and is fitted with a bellows 52 at the pump and also one 56 at the termination of the initial line. The bellows 56 is capped of with a flange 58 and the assembly is evacuated and tested using appropriate leak testing equipment. During the entire period of pump installation and testing the processing floor 30 is unperturbed, save for the presence of the opening 36 and the capped off vacuum line 58. A temporary seal or cover may be applied over the opening 36 and the cap 58 during the testing and qualification period.

Figure 2:
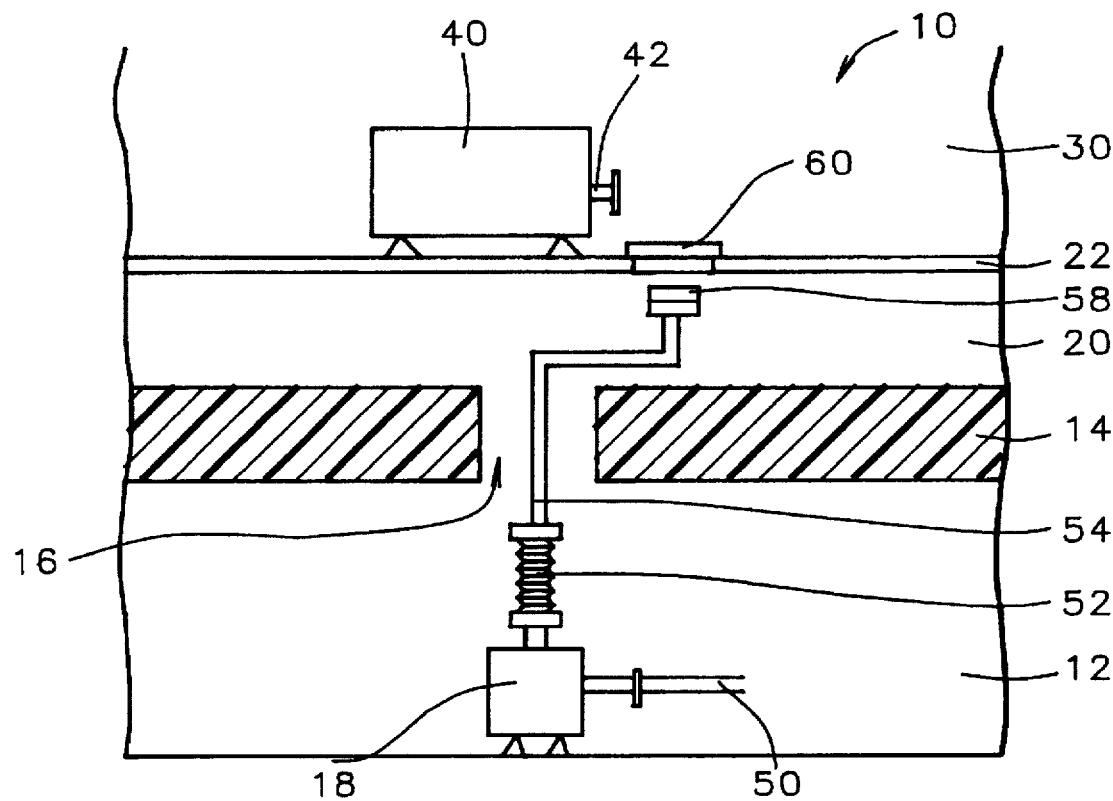
FIG. 2 is a cross section of the configuration of the first embodiment of this invention after testing and prior to process tool hook-up.

After the pumping assembly is qualified, referring now to FIG. 2, the bellows 56 is removed, the end of the pipe 54 is capped by the flange 58 and the floor opening 36 is covered with a plate 60 which remains until the piece of equipment 40 is moved in and connected. The bellows 56 is then re-installed and the remaining connection is made to the tool 40 at its port 42. Water coolant lines, electrical and other service connections are now quickly made and the tool can be promptly placed in service.

Figure 3:
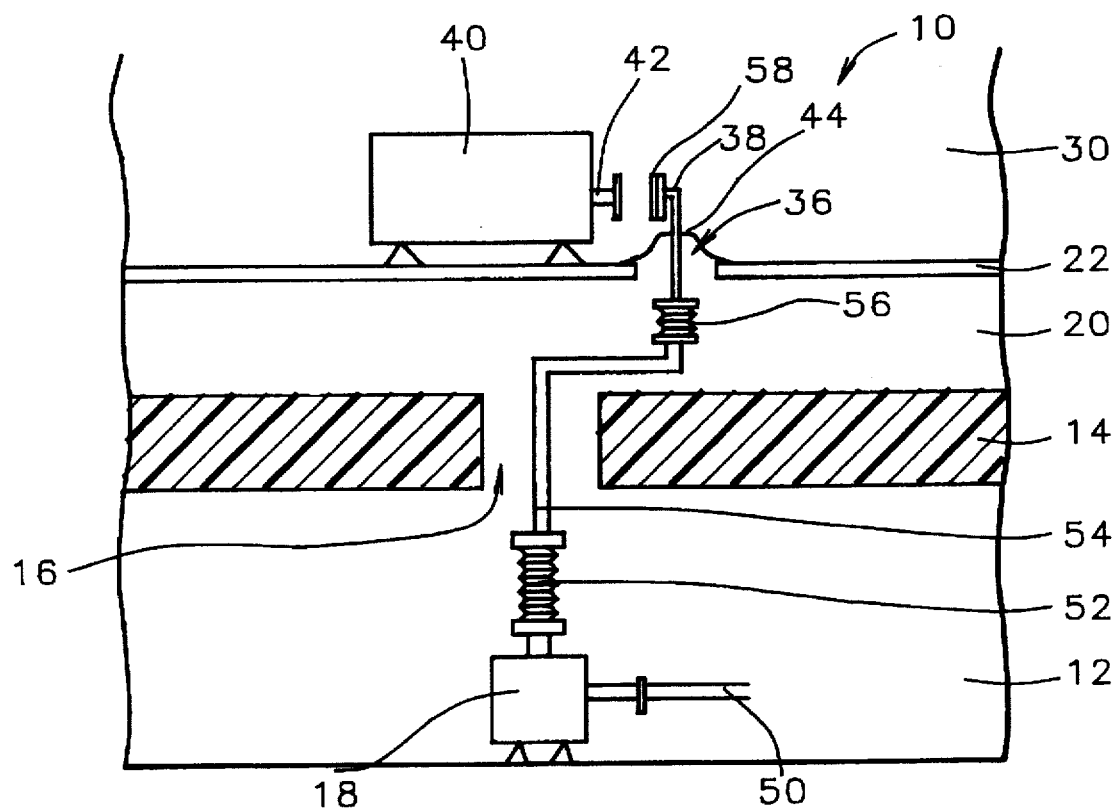
FIG. 3 is a cross section of the configuration of the second embodiment of this invention after pump testing and prior to process tool hook-up.

In a second embodiment of this invention, illustrated by FIG. 3, the bellows 56 is positioned below the raised floor 22 and above the re-enforced concrete floor 14. In this configuration, an additional piece of the pumping line 38 is in place during the pumping equipment testing and qualification. The total assembly capped off by the flange 58, is tested and left in place until subsequent moving in and installation of the processing tool 40, whereupon the flange 58 is removed and the attachment is made to the equipment at 42. Any floor seal 44 required is permanently installed at this time.

Figure 4:
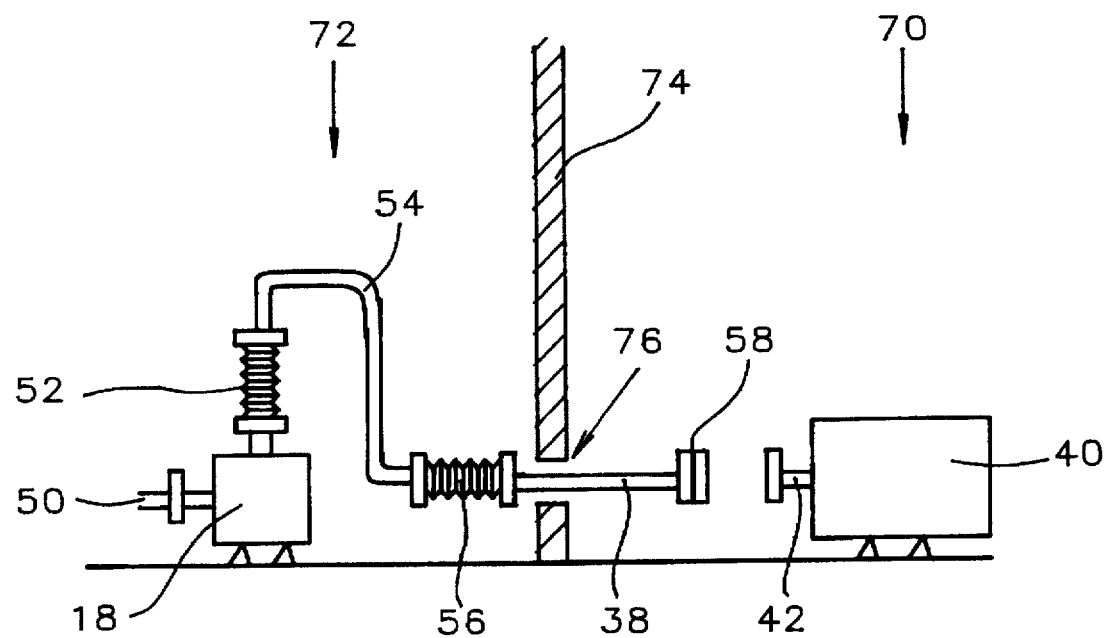
FIG. 4 is a cross section of the configuration of the third embodiment of this invention after pump testing and prior to process tool hook-up.

A third embodiment of this invention, as practiced in a single floor manufacturing facility, is illustrated by FIG. 4. Here the roughing pump equipment 18 is located in a core area 72 on the same floor level as the clean room area 70. A wall 74 isolates the core area 72 from the clean room area 70. As in the previously described embodiments, the rough pumping station 18 and its associated piping and support equipment are installed and tested before the processing tool 40 arrives in the clean room area 70.

Electrical power is provided to the pump unit 18 from supplies located within the core area 72. The exhaust 50 of the pump unit is routed to appropriate exhaust processing equipment such as scrubbers and filters also located within and outside of the core area 72.

The suction line 54 from the pump body is constructed of appropriate materials and is fitted with a bellows 52 at the pump and also one 56 at the termination of the first section of piping 54. The bellows 56 is preferentially located within the core area 72 and is connected to the second section of piping 38 which passes through an opening 76 In the wall 74, capped of with a flange 58.

The assembly is evacuated and tested using appropriate leak testing equipment. During the entire period of pump installation and testing the activity on the processing floor 70 is unperturbed, save for the presence of the capped piping 38. A temporary seal or cover may be applied over the opening 76 and the cap 58 during the testing and qualification period.

After the pumping assembly is qualified, the processing tool 40 is moved into place in the clean room area connections are quickly and easily made to the piping 38. Any requires water coolant lines, electrical and other service connections are now quickly made and the processing tool can be promptly placed in service.

While the invention has been particularly shown and described with reference to the preferred embodiments thereof, it will be understood by those skilled in the art that various changes in form and details may be made without departing from the spirit and scope of the invention.

What is claimed is:

1. A method for installation and qualification of a processing tool requiring rough pumping equipment in a multi-level building with minimal disruption of ongoing production line operation in a clean room environment comprising:

providing a multi level building with a designated location for said processing tool located in a clean room area on a second floor and facilities for auxiliary equipment in an area located on a first floor;

installing said rough pumping equipment on said first floor directly below said designated location for said processing tool;

providing said rough pumping equipment with power and with discharge handling facilities for proper disposition of exhaust gases from said rough pumping equipment;

providing piping from an inlet port of said rough pumping equipment to a termination at an opening in said second floor in proximity to said designated location for said processing tool;

providing a vacuum tight closure over said termination;

attaching test equipment to said rough pumping equipment;

performing testing and qualification procedures to assure proper functionality of said rough pumping equipment and said piping;

removing said test equipment;

placing said processing tool in said designated location on said second floor;

removing said vacuum tight closure subsequent to completion of said testing and qualification procedures; and installing a vacuum tight piping connection between said termination and a vacuum port on said processing tool.

2. The method of claim 1 wherein said piping contains a first bellows at said inlet port and a second bellows at said termination.

3. The method of claim 2 wherein said second bellows is located within said opening in said second floor.

4. The method of claim 3 wherein said second bellows is removed after said testing procedures are performed and said piping is capped with a flange.

5. The method of claim 1 wherein said piping contains a first bellows at said inlet port and a second bellows between said first bellows and said termination.

6. The method of claim 5 wherein said second bellows is located below said opening in said second floor.

7. The method of claim 1 wherein said second floor consists of a raised floor located over a re-enforced concrete waffle floor.

8. The method of claim 7 wherein said second bellows is located above said re-enforced concrete waffle floor.

9. The method of claim 1 wherein said testing procedures include leak testing of said piping, functionality of said rough pumping equipment, and functionality of said discharge handling facilities.

* * * * *